United States Patent [19]

Fuse et al.

[11] 4,041,517
[45] Aug. 9, 1977

[54] VERTICAL TYPE JUNCTION FIELD EFFECT SEMICONDUCTOR DEVICE

[75] Inventors: Noboru Fuse; Kenichi Muramoto, both of Hyogo, Japan

[73] Assignee: Tokyo Shibaura Electric Co., Ltd., Tokyo, Japan

[21] Appl. No.: 604,024

[22] Filed: Aug. 12, 1975

[30] Foreign Application Priority Data

Sept. 4, 1974  Japan .................................. 49-10155

[51] Int. Cl.² ...................... H01L 29/80; H01L 27/02
[52] U.S. Cl. ......................................... 357/22; 357/41
[58] Field of Search ..................................... 357/22, 41

[56] References Cited

U.S. PATENT DOCUMENTS 3,841,917  10/1974  Shannon .............................. 357/22

*Primary Examiner*—Edward J. Wojciechowicz
*Attorney, Agent, or Firm*—Oblon, Fisher, Spivak, McClelland & Maier

[57] ABSTRACT

A vertical type junction field effect transistor is disclosed having a body of semiconductor material of a first conductive type, a source region of the first conductive type provided in a main face of the body and a drain region of the first conductive type disposed opposite to the source region. A gate region of a second conductive type opposite to the first conductive type is disposed in direct contact with the source region and surrounds the source region in the form of a closed loop. A channel region extends from the source region towards the drain region and has a varying width in the vicinity of the source region according to the change of a depletion layer upon voltage application to the gate region.

8 Claims, 32 Drawing Figures

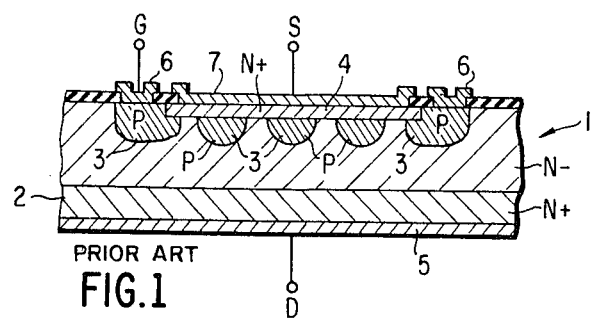
PRIOR ART
FIG.1
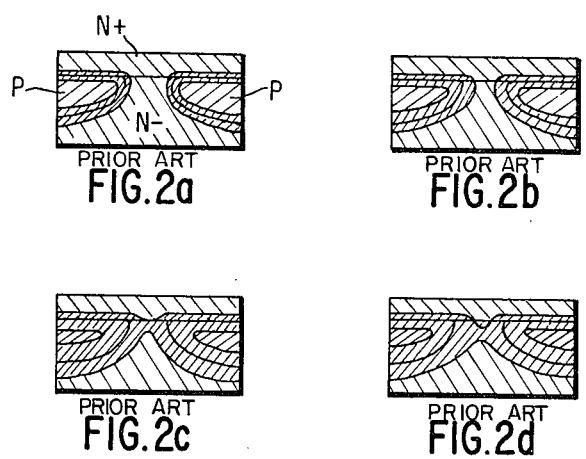
PRIOR ART
FIG.2a
PRIOR ART
FIG.2b
PRIOR ART
FIG.2c
PRIOR ART
FIG.2d
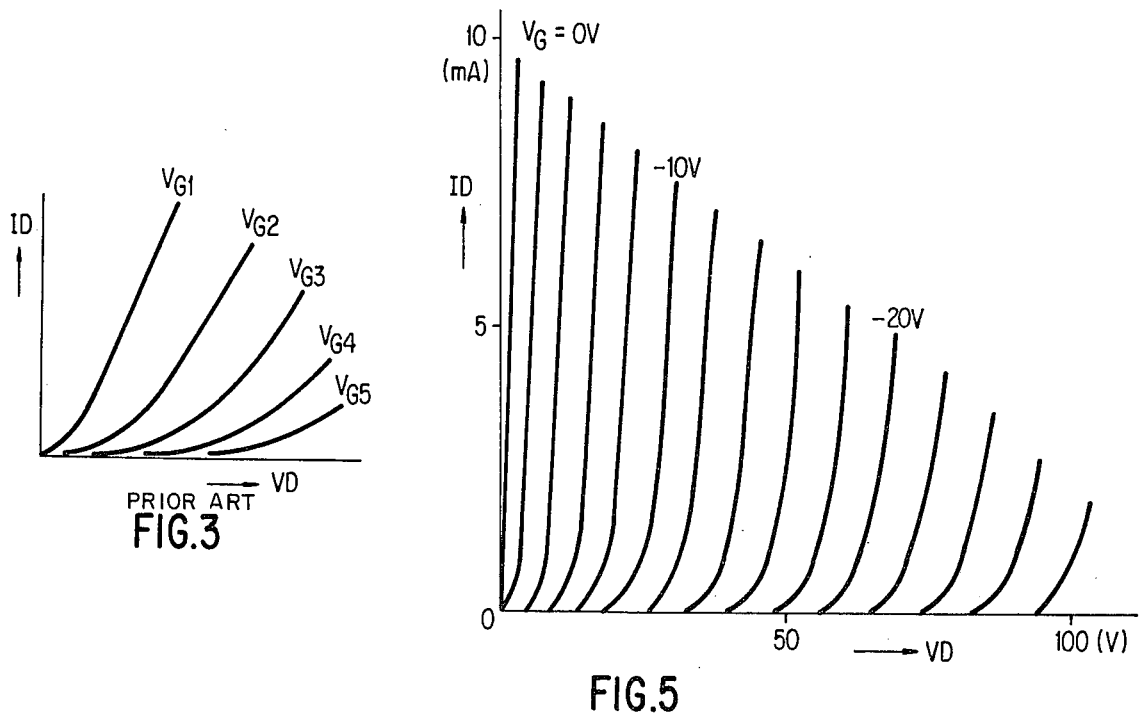
PRIOR ART
FIG.3
FIG.5

VERTICAL TYPE JUNCTION FIELD EFFECT SEMICONDUCTOR DEVICE

BACKGROUND OF THE INVENTION

1. Field of the Invention

This invention relates to vertical type junction field effect transistors.

2. Description of the Prior Art

Recently the development of vertical type junction field effect transistors (hereinafter referred to by the abbreviation FET) having triode characteristics has occurred, and attention has been particularly directed to them by the fact that they can be used as elements for controlling relatively large quantities of electric power. FIG. 1 shows the structure of a known multi-channel vertical type FET which is useful in integrated circuits. The body 1 of the device consists for example of an N− type region with an N+ type layer beneath it. In the top surface of the N− region, a plurality of P+ type gate regions 3 are formed as an interconnected mesh and a shallow source region 4 of N+ conductivity type is formed so as to overlie most of the gate regions. A plurality of channel regions are present in the high resistance N− region and are positioned between the various gate regions 3 whereby current flowing through the channel regions between the drain and source of the device is controlled. D is a drain terminal which is connected to drain electrode 5 provided for example by vacuum evaporation of aluminum or the like on the bottom surface of the body 1. G and S are, respectively, a gate terminal and a source terminal which are connected respectively to a gate electrode 6 and a source electrode 7 which are similarly provided.

A vertical type FET having the structure described above is designed so as to make use, to the extent possible, of the advantages of the bipolar type of element and of the electric field effect transistor, and in the same vertical type FET there is an epitaxial structure in which gate regions are embedded in the interior of the body of the device by the gas phase growth method. By the method described hereinafter, the above mentioned vertical type FET has a double diffusion structure whereby the process of its manufacture is very greatly simplified.

More specifically the body 1 of the device consisting of the N− type region and the N+ type layer, which subsequently becomes the drain region, is formed and an oxide film is provided on the top surface of the N− type region and on top of this film a film of photo resist is provided. This photo resist film is selectively etched and holes are formed in the oxide film in order to form the gate regions. A mask in the form of a round or square mesh is used, and the mesh covers the parts where the source regions are to be formed. The width of the mesh forming the gate regions is about 5 microns, and boron, for example, is diffused as a P type impurity into the N− type region. After these P type gate regions have been formed, the gate regions are covered with an oxide film. Then, a large window overlying approximately the whole of the gate regions is formed in the oxide film. Through this window an N type impurity, for instance, phosphorus or the like, is shallowly diffused in a high concentration so that an N+ type source region 4 is formed so as to substantially cover the gate regions 3 as shown in FIG. 1.

The PN junction surfaces are not exposed at the surface of the body of the device and the junction capacitance is smaller than in previously known FETs, besides which the resistance to voltage is improved. This is because the gate and source regions are formed by N− P+ junctions, the current between the drain and source exhibits triode characteristics and the characteristic of the saturation current flowing through the channel regions is improved.

FIG. 2 illustrates the states of a depletion layer in a channel region to show the principle of operation of this vertical type FET. FIG. 2a shows the state of the depletion layer in the vicinity of the gate junctions when there is no gate bias voltage $V_G$. This depletion layer when bias is not applied is produced by the internal electric field which is present at the PN junction between gate and source.

If a voltage $V_D$ is applied between the source and drain, a drain current $I_D$ flows readily in the channel region and the $V_D$ $I_D$ characteristics of the device is shown in FIG. 3. However, if a gate voltage $V_G$ is applied then, as shown in FIG. 2b, the depletion layer extending outwardly from the gate regions narrows the width of the channel which is between the gate regions and the drain current $I_D$ flows less readily and the $V_D$−$I_D$ characteristic varies as shown in FIG. 3 and in a form in which the channel resistance becomes greater. If an even greater negative gate voltage $V_G$ is applied, then, as shown in FIG. 2c, the depletion layer from the gate regions "pinches off" the channel region. Thus, even though the drain voltage $V_D$ is applied, the channel is blocked by the depletion layer and the drain current $I_D$ does not flow. Of course, if an additional drain voltage $V_D$ is applied, breakdown of the depletion layer occurs and current can be made to flow. FIG. 2d shows the state of the depletion layer immediately before the breakdown; the drain voltage $V_D$ causing transformation to occur on the drain region side. Thus, as shown in FIG. 3, as the gate voltage $V_G$ becomes increasingly negative, the drain voltage $V_D$ necessary for commencement of the flow of the drain current $I_D$ becomes greater and it becomes possible to approximately obtain the characteristics of a triode.

Again considering a vertical type FET having these characteristics, with reference to the embodiment shown in FIG. 1, it is found that the spacing of the gate regions 3, that is to say the width of the channel regions, is determined by the diffusion of an N+ layer as the source region 4 under the source electrode 7. The gate regions 3, accordingly, are mutually continuous in mesh form in a plane. However, above the gate regions where a gate electrode 6 is not provided, the gate regions 3 are prevented by the above mentioned N+ layer from being exposed to the surface of the main body 1 of the device. Therefore, in the vicinity of the surface, the gate regions are in a form in which they are cut off by the second diffusion of the N+ layer. Accordingly, the gate series resistance $r_G$ becomes large, the extension of the depletion layers in the channel regions does not readily pinch off the channels, the junction plane of the gate regions 3 and the source region 4 is so formed as to extend over the whole top surface of the gate regions 3 and the junction capacity $C_{GS}$ becomes large. Therefore, the time constant $C_{GS} \cdot r_G$ on the gate input side becomes large and during high frequency operation the drain current $I_D$ cannot be controlled.

SUMMARY OF THE INVENTION

It is an object of the present invention to provide a vertical type junction field effect semiconductor device which is not subject to the above noted deficiencies and which is of improved operation.

It is a further object of the present invention to provide a vertical type junction field effect semiconductor device having improved high frequency characteristics.

The foregoing and other objects are attained in accordance with one aspect of the present invention through the provision of a vertical type junction field effect transistor comprising: a body of semiconductor material of a first conductive type, a source region of the first conductive type provided in a main face of the body, a drain region of the first conductive type disposed opposite to the source region, a gate region of a second conductive type opposite to the first conductive type disposed in direct contact with the source region and surrounding the source region in the form of a closed loop, and a channel region extending from the source region towards the drain region and having a varying width in the vicinity of the source region according to the change of a depletion layer upon voltage application to the gate region.

BRIEF DESCRIPTION OF THE DRAWINGS

Various objects, features and attendant advantages of the present invention will be more fully appreciated as the same becomes better understood in connection with the accompanying drawings, in which:

FIG. 1 is a sectional elevation of a known vertical type FET,

FIGS. 2a – 2d are operating diagrams of the vertical type FET of FIG. 1,

FIG. 3 shows the $V_D - I_D$ current characteristics of the known FET,

FIG. 5 shows the $V_D - I_D$ current characteristics of the FET of FIG. 4, FIGS. 6 – 8 show steps in the manufacture of FETs in accordance with second to fourth embodiments of the invention.

DETAILED DESCRIPTION OF THE PREFERRED EMBODIMENTS

Figure 4A:
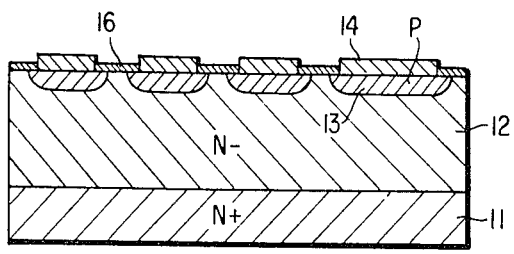
FIGS. 4a – c shows steps in the manufacture of a FET in accordance with a first embodiment of the invention.
Figure 4B:
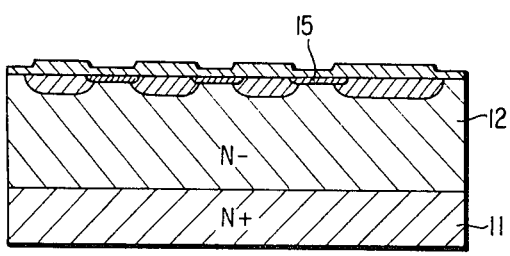
Figure 4C:
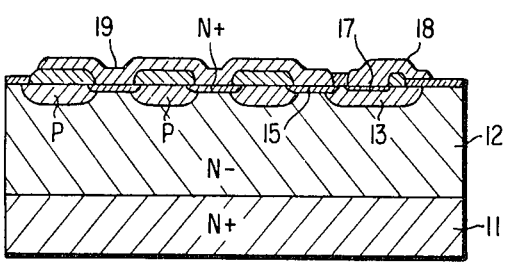

Referring now to the drawings, wherein like reference numerals designate identical or corresponding parts throughout the several views, embodiments of the present invention as applied mainly to an N channel FET will now be described with reference to the drawings. First, as shown in FIG. 4, the body of the device having a layered structure consisting of an N+ diffusion layer 11 and an N— type region 12, as used in manufacturing of triple diffusion type transistors, is prepared. The same structure is obtained in which an N— layer obtained by gas phase growth is formed as a layer on the surface of a highly doped substrate (body). Next, a boron doped $SiO_2$ glass layer 14, (hereinafter called a BSG layer) is established on the upper surface of the N— type region by growth of a low temperature gas phase including boron oxide. Using the technique of photo engraving, the part of the BSG layer 14 for forming the gate regions 13 by diffusion is shaped by removing the excess parts by etching with a fluorate chemical agent. Thus, the BSG layer, is used as a diffusion impurity source in effecting diffusion of boron. In this case, if in subsequently diffusing and forming the source region 15, photoengraving is used so that selective diffusion is carried out, reduction of the yield will occur. Therefore, the aforesaid boron diffusion is carried out in a weakly oxidizing atmosphere so that the silicon dioxide layer 16 formed by heat treatment of the gate diffusion on the surface of the region where the source will subsequently for formed does not become too thick. For example, as conditions for establishing the BSG layer 14, the temperature of the body is 450° C and the heat treatment is carried out for 5 minutes in a mixed gas atmosphere so that the flow rate of nitrogen gas is 35 lit/min, the flow rate of diborane gas having a concentration of 50 ppm is 0.5 lit/min and the flow rate of oxygen gas is 0.3 lit/min. In this case, the thickness of the BSG layer becomes 300 A and a 3000 A highly pure silicon dioxide layer is established on its surface by treatment under the above conditions but with the flow of diborane gas stopped. As conditions for the diffusion of the gate region, heat treatment is carried out for 40 hours at a temperature of 1030° C in a mixed gas atmosphere so that the flow rate of oxygen gas is 0.1 lit/min and the flow rate of nitrogen gas is 3 lit/min. By use of this heat treatment, a gate region 13 of surface concentration of $3 \times 10^{16}$ atoms/cm$^3$ and a junction depth of 2.6$\mu$ are obtained. Under these circumstances, the thickness of the silicon dioxide layer 16 grown on the exposed surface of the N— type layer becomes 300 A and by use of the fluorate etching liquid only this silicon dioxide layer is etched and removed. The remaining BSG layer is used as a mask in carrying out the selective diffusion of the source layer 15. In this diffusion, the technique ordinarly used for forming the emitter layer of planar transistors is applied. Thus, the conditions of treatment were as follows; heat treatment was carried out at 1000° C for 10 minutes in a phosphorous oxychloride vapour and oxygen and nitrogen mixed gas atmosphere at 0° C and the source region 15 was established. At the same time an extremely thin phosphorous glass layer was formed on the surface of the source region 15 and the surface impurity concentration of the source region was of the order of $10^{20}$ atoms/cm$^3$ and the depth of diffusion was 1$\mu$. The direct current resistance portion of the gate regions innumerably ramified by diffusion is made small so that the gate voltage acts equally on the whole surface of the element with the object of making it act uniformly over the whole area of the source region by disposing a low resistance portion 17 in one portion of the gate region. The portion is made with a comparitively large width. A part of the BSG layer 14 of that portion is etched and removed by the photoengraving technique. In the gate region where this etching and removal has taken place, boron is diffused so that a boron highly doped addition layer 17 is established. To achieve the object set forth above, in order to ensure that the resistance of the contact with the electrode metal layer 18 (which is formed subsequently) will be a non-rectifying contact, the diffusion layer 17 should have a surface concentration of not less than $10^{19}$ atoms/cm$^3$ and it may be extremely shallow. In order to achieve the same effect, the highly doped addition layer 17 may be established beforehand, before the gate region 13 is established, and before the diffusion of the gate and source regions is effected. Next, the glass layers grown by the heat treatment for forming the highly doped addition layer 17 and the source region 15 are removed by the fluorate etching liquid and the gate electrode 18 and source electrode 19 are established on their respective surfaces. The drain electrode is led out from the N+ type layer 11 and the vertical type FET is complete.

The vertical type FET is formed by the N+ type layer 11 which occupies most of the drain region, the P type gate regions 13, the group of N+ type source regions 15 and the N− type region 12 in which the channel regions are formed in the vicinity of the contacting parts of these elements. For example, if the specific resistance of the N− type region is 30Ω cm and its thickness is 20μ, and if by the method described above the source and gate regions are so formed that the area of one source region is $6 \times 50\mu^2$ and the total area of the source regions is 0.26 mm², the static voltage/current characteristics of the device will be as shown in FIG. 5 and typical triode characteristics will be obtained.

The vertical type FET obtained as described above is superior in its characteristics to the one obtained by the known technique as shown in FIG. 1. Thus, the structure is such that the source regions are directly surrounded by the gate regions and therefore the PN junctions between the source regions and the gate regions are only at the edges of the regions 15. Accordingly, the capacitance due to the PN junctions is small. Also, the top parts of the gate regions that are left have a relatively high concentration and are not eliminated for the purpose of establishing the source regions as in the case of the prior art shown in FIG. 1. Therefore, the specific resistance of the gate can be kept small. Because the above mentioned capacitance $C_{GS}$ is small and because the series resistance $r_G$ of the gate regions is small, the vertical type FET of the invention has superior high-frequency characteristics. Also, in making the main body of the FET, the fitting of a mask for the purpose of photoengraving need be done only once. More specifically after the BSG layer is selectively removed, the BSG layer remaining after the removal may be used as a mask in forming the source regions. Therefore, there is absolutely no error in the mask fitting. The parts of the source and gate regions which overlap one another are extremely small and the reduction of the resistance to voltage is very small. Accordingly, in high power FETs having a plurality of channels, uniformity of characteristics can be obtained. Also, there are practically no faults introduced by mask defects and photoengraving and the percentage of usable devices produced is quite high. Moreover, mass production of the product is improved.

Figure 6A:
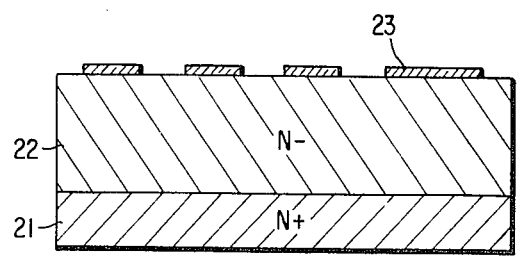
Figure 6B:
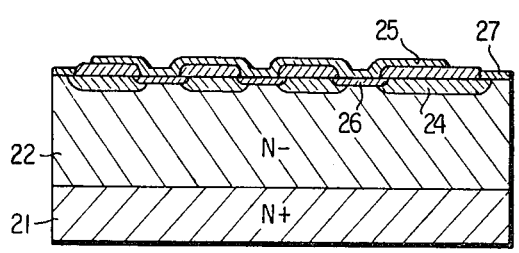

A second embodiment of the present invention will now be described with reference to FIG. 6. In this embodiment, the gate regions and the source regions are formed separately from one another with doped oxide. The following description concerns an N channel FET. First, the body of the device having a layered structure consisting of an N+ type diffusion layer 21 and an N− type layer 22 is prepared. By using the method described with reference to FIG. 4, gate regions 24 are formed by diffusion from a BSG layer 23. Subsequently, a fluorate etching liquid is used to remove the silicon dioxide layer formed on the surface of the N− type layer 22 between the BSG layers 23 at the time of the gate diffusion. Next, a layer 25 of silicon dioxide to which phosphorus atoms have been added and which is produced by low temperature gas phase growth (Phos. doped SiO₂ glass, hereinafter referred to as PSG) is positioned over the whole surface of the N− region including the surfaces of the BSG layers 23 and this PSG layer 25 is etched away leaving only the parts necessary for the formation of the source regions 26, i.e., the parts between the gate regions 24. Then, using the BSG layers as a mask, selective diffusion of phosphorus atoms from the PSG layers is effected and the source regions 26 are established. With respect to the diffusion at this time, heat treatment is carried out in a weakly oxidizing atmosphere or after the completion of diffusion oxidation is carried out and the parts of the junctions of the gate regions 24 exposed at the surface are stabilized and protected by a new silicon dioxide film 27. A source electrode 28 is established on the source regions 26 in the parts where the PSG layers 25 have been removed by an etching liquid. Likewise, a gate electrode 29 is established on parts of the gate regions 24 where the PSG layer 25 and BSG layer 23 have been removed by the etching liquid. A drain electrode is let out from the N+ type layer 21 and the vertical type FET having triode characteristics is completed.

Figure 6C:
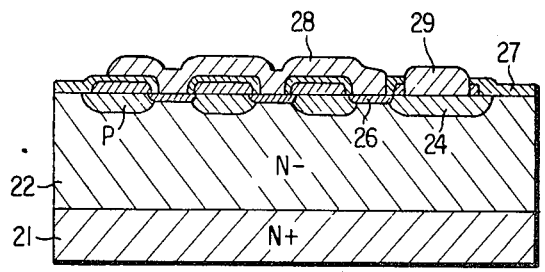

In this way, it is possible to make the gate and source regions by using BSG and PSG layers. P channel FETs can also be made in a similar way by using mixed glass. The FET constructed as shown in FIG. 6(c) has substantially the same structure as that of FIG. 4(c) and therefore produces the same effect.

Figure 7A:
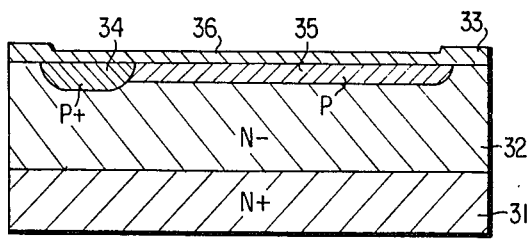
Figure 7B:
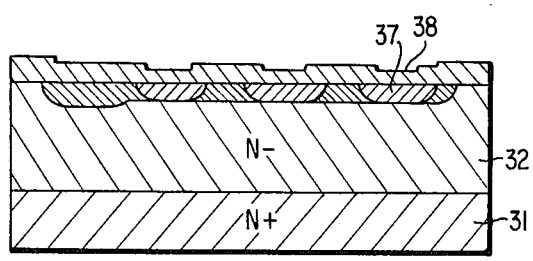
Figure 7C:
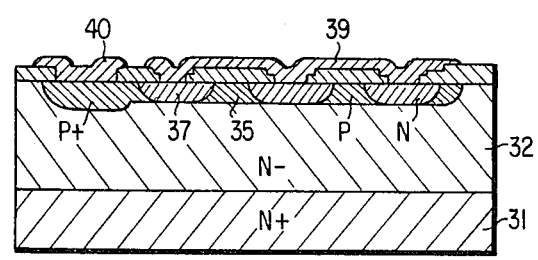

A third embodiment of the present invention will now be described with reference to FIG. 7. In this embodiment, the source regions are formed with approximately the same depth as the gate regions. This description concerns an N channel FET. First, the base of the device having a layered structure consisting of an N+ type diffusion layer 31 and an N− type region 32 is prepared. Photoengraving treatment for establishing the source regions is carried out by the same method as is used in the pellet manufacturing process of planar transistors. More particularly, a silicon dioxide layer 33 is formed on the upper surface of the body by heat oxidization. Then, in order to make the series resistance of the gate region small, which will be formed later, a small part of the silicon dioxide layer 33 is removed by a photoengraving process and diffusion of boron is effected through the part where the silicon dioxide layer has been removed whereby a P+ type diffusion layer 34 is formed. Next, a hole is made by photoengraving in the partial silicon dioxide layer 33 so as to expose this P+ type diffusion layer 34. The source regions which will be stabilized in a subsequent step and boron is diffused through this hole so that a P type diffusion layer 35 is established. Of course, during the diffusion treatment, oxidization is secured on the surface of this diffusion layer 35 and a new silicon dioxide layer 36 is formed at the same time. Then, holes are made by photoengraving in a part of this silicon dioxide layer 36 above the regions where the sources are to be formed and selective diffusion by means of phosphorus atoms is effected until the N− type layer 32 is reached so that N+ type source regions 37 are established. Simultaneously with this diffusion, a new sillicon dioxide film 38 is formed. Next, holes are made, by a photoengraving treatment, in the part of the silicon dioxide film 38 above the source regions 37 and in the part of the silicon dioxide film 36 above the P+ type diffusion layer 34. A source electrode 39 and a gate electrode 40 are established respectively in these holes. A drain electrode is led out from the N+ type layer 31 and the vertical type FET is complete.

As described above, the group of source regions 37 is surrouned by the gate region 35 and the depth of diffusion of the source regions 37 is approximately the same as that of the gate region 35 whereby triode characteristics can be obtained. The matters that must receive attention when the apparatus is made with this structure are as follows. First, the impurity concentration of the gate region and the impurity concentration of the source regions must be made low. The reason for this is that if these regions are given too high a concentration, it is likely to cause reduction of the voltage resistance of the gate and make the range of operation narrow. Also, it is undesirable for the difference in concentration between the gate and source regions to be too great. The reason for this is that if the region is given an extemely low concentration in order to realize a high resistance of the gate to voltage, the depletion layer due to the gate bias cannot spread out at the sides of the gate region and cannot change the channel region into a depletion layer. Also, if the FET of FIG. 7(c) the width of the source region is made large, the width of the channel regions formed immediately below then is extended and there is a danger that during operation the depleteion layers may be unable to pitch off the channels with the result that the FET operation may be impaired. Also, with regard to the aforesaid gate voltage resistance, the gate region is formed with as low a concentration as possible. Therefore, an increase of the gate series resistance to a certain extent is unavoidable. This increase in the gate series resistance causes difficulties in high frequency operation. However, in order to correct this it is possible to effect a solution by providing a P+ type region in a continuous part of the gate region 35 consisting of a P type region when seen in a plane.

A FET made with due regard to the above points has outstanding high frequency characteristics because its structure is such that the source regions are directly surrounded by the gate regions. Moreover, it can be easily manufactured by simple techniques.

The gate region and the source regions in this embodiment do not have to be made by the diffusion method; they may be made for instance by the doped oxide method as in the first and second embodiments.

Figure 8A:
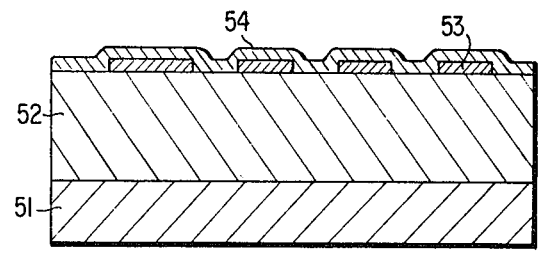
Figure 8B:
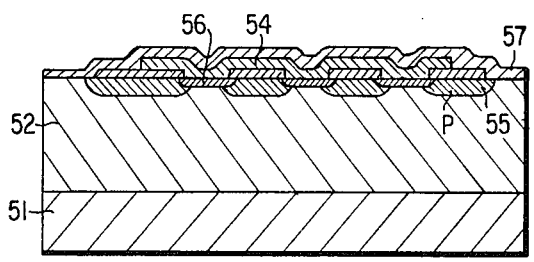
Figure 8C:
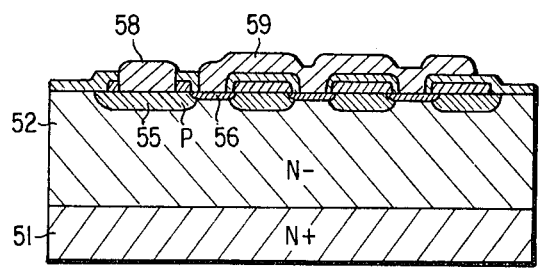

A fourth embodiment of the present invention will now be described with reference to FIG. 8. In this embodiment, the gate regions and the source regions are formed simultaneously by means of doped oxide. The following description concerns an N channel FET. First, the body of the device having a layered structure consisting of an N+ type diffusion layer 51 and an N− type region 52 is prepared. A BSG layer 53 is established over the whole upper surface of the body by the low temperature gas phase growth method. By means of the photoengraving technique, parts of the BSG layer are left for use as diffusion sources for forming the gate regions by diffusion. The rest of the BSG layer is etched chemically and removed. Next, a silicon dioxide layer 54 containing arsenous acid (arsenic doped $SiO_2$ glass, hereinafter referred to as $A_sSG$) is established over the whole area of the upper surface of the body. By means of the photoengraving technique, parts of the AsSG layer 54 are left as diffusion sources for forming the source regions by diffusion. The rest of the $A_sSG$ layer is chemically etched and removed. If the body is subjected to heat treatment at a suitable temperature, because of the differences in the magnitudes of the diffusion coefficients of the arsenic and boron atoms, the required gate regions 55 and source regions 56 can be simultaneously established in the N− type region 52. At the same time, in order to protect and stabilize the PN junctions at the periphery of the gate regions, a silicon dioxide layer 57 is established over the upper surface of the device. In this method, oxidisation may take place at any time during the above mentioned heat treatment, but it is best if an oxidizing atmosphere is supplied at the end of the heat treatment so as to form the silicon dioxide layer 57. Also, if the above mentioned BSG layer and AsSG layer are established as diffused impurity sources by the low temperature gas phase growth method and the whole surface is coated with a highly pure silicon dioxide layer and then diffusion heat treatment is carried out so that during this step high density concentration is produced (and generally in this kind of diffusion a weakly oxidizing atmosphere is used), a heat-oxidized film is formed between the surface of the N− type layer 52 and the highly pure silicon dioxide layer and stabilized PN junctions are formed.

The advantages of the structure described above are that in this structure the source regions are directly surrounded by the gate regions and therefore the high frequency characteristics are excellent. Furthermore, as the source and the gate regions are formed by a single heat treatment, the crystal defects introduced by deformation produced by heat treatment are halved. Also, the source and gate regions can be reliably established merely by correctly controlling the impurity atoms in the BSG layer and the AsSG layer.

An example of the procedure for obtaining the above mentioned structure will now be described. The conditions for establishing the BSG layer 53 may be the same as in the case of the embodiment of FIG. 4. The conditions for establishing the AsSG layer 54 are as follows: if the base plate temperature is 450° C, silane gas having a concentration of 3% flows at a 0.7 lit/min, arsine ($AsH_3$) having a concentration of 1000 ppm flows at 0.8 lit/min, oxygen flows at 2.5 lit/min and nitrogen flows at 35 lit/min while the whole is thoroughly stirred, gas phase growth is carried out for 5 minutes and an AsSG layer of about 3000 A can be formed. The parts necessary for the formation of the source regions 56 by diffusion are left. The rest of the AsSG layer is removed by a photoengraving treatment. The diffusion sources made in this way, that is to say the BSG layers 53, are masked by the AsSG layer. Therefore, the BSG layers are used as sources for the diffusion of boron atoms in a directly downward direction, P type gate regions 55 are formed by diffusion and the AsSG layer 54 is masked by the BSG layer 53 and forms N+ type source regions 56 by diffusion of arsenic atoms. When these glass diffusion sources are used and the whole of the base plate is subjected to heat treatment at 1050° C for 80 hours, the diffusion parameters of the gate and source regions are respectively diffusion depth $4\mu$ and $1.5\mu$ and diffusion surface concentration $3 \times 10^{16}$ and $1 \times 10^{17}$ atoms/cm$^3$. This heat treatment is, of course, carried out in a weakly oxidizing atmosphere and the parts of the silicon that appear on the surface of the PN junction at the periphery of the gate regions are oxidized and a silicon dioxide layer 57 for stabilizing and protecting the surface is established. A source electrode 59 and a gate electrode 58 are led out from the respective source regions 56 and gate regions 55 and a drain electrode is led out from the N+ type layer 51 and the vertical type FET is completed.

Also, in the four embodiments described above, various steps based on the embodiments described hereinafter may be added and the four embodiments may be formed in a range that does not depart from the essence of the present invention.

Figure 9A:
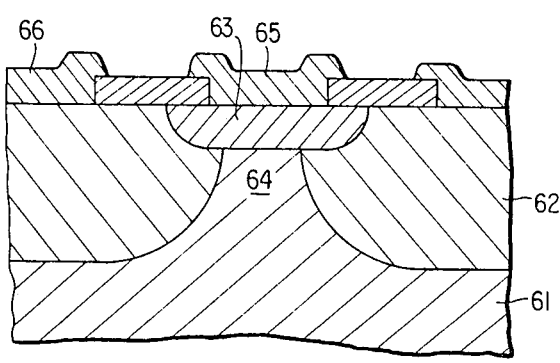
Figure 9B:
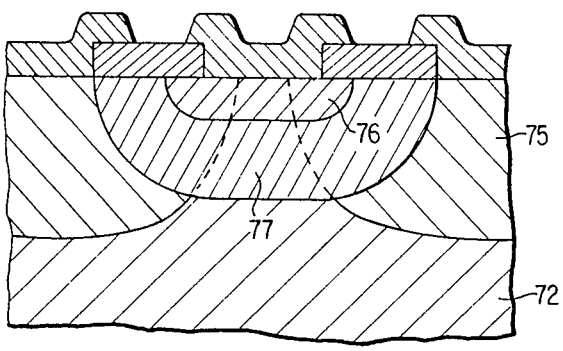

A fifth embodiment of the present invention will now be described with reference to FIG. 9 and FIG. 10. In general, it is necessary to freely control the voltage amplification rate $\mu$ of an FET which is its important characteristic. But, in the known techniques for the control of the concentration of the diffused impurities, the general practive is to evaporate the impurity atoms or oxides once and diffuse them from the gas phase. Therefore, precise control of the diffused impurity concentration is impossible. On the other hand, $\mu$ is greatly affected by the dimensional design of the gate and source regions and by the specific resistance of the channel regions. Therefore, with the same process, it was almost impossible to vary $\mu$ freely. FIG. 9a is a sectional drawing showing the state of a channel region immediately below a source region. In the Figure, 61 is the N type drain region, 62 is the P type gate region, 63 is the N+ type source region and 64 is the channel region. Generally, channel 64 has the same specific resistance value as the drain region 61 so that if a voltage is applied in the reverse direction between the source electrode 65 and the gate electrode 66 the resistance of the channel region in the vertical direction is gradually increased by the depletion layer spreading from the PN junctions. This voltage dependency is physically determined by the specific resistance of the channel 64. It has been discovered that when the source region is being diffused, it is possible to diffuse simultaneously two or more impurities having different diffusion coefficients to change the specific resistance value of the channel region 64 and control the value of $\mu$.

Figure 10A:
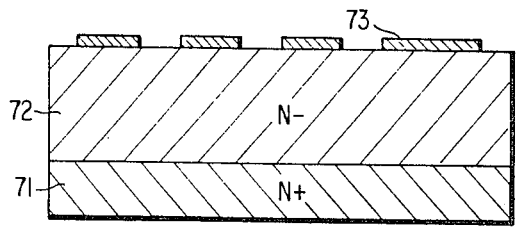
FIGS. 9 and 10 show steps in the manufacture of a FET in accordance with a fifth embodiment of the invention.
Figure 10B:
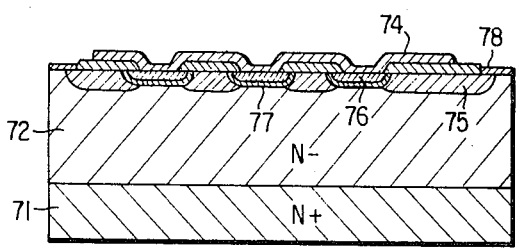
Figure 10C:
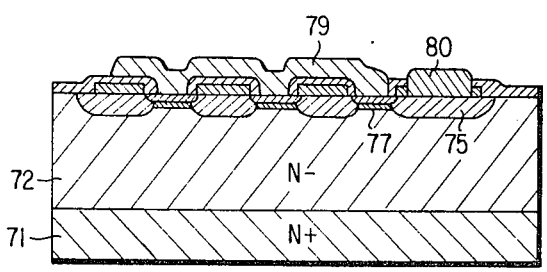
Figure 11A:
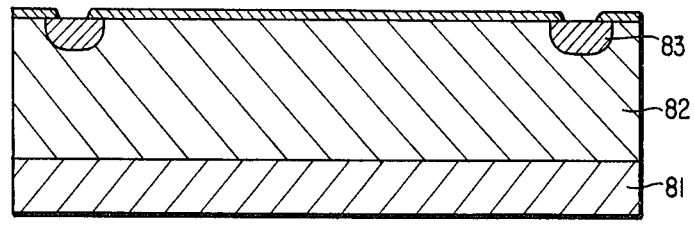
FIGS 11 to 13 show steps in the manufacture of FETs in accordance with sixth to eighth embodiments of the invention.
Figure 11B:
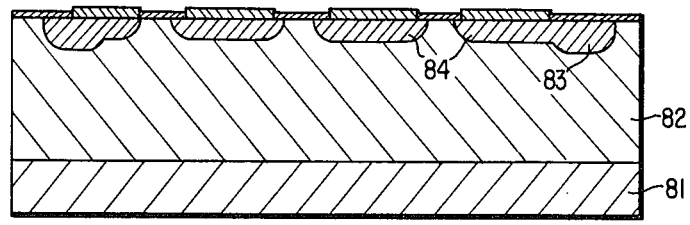
Figure 11C:
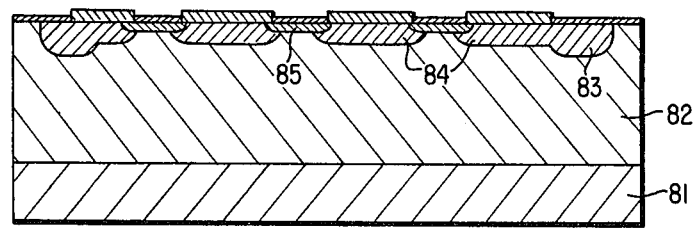
Figure 11D:
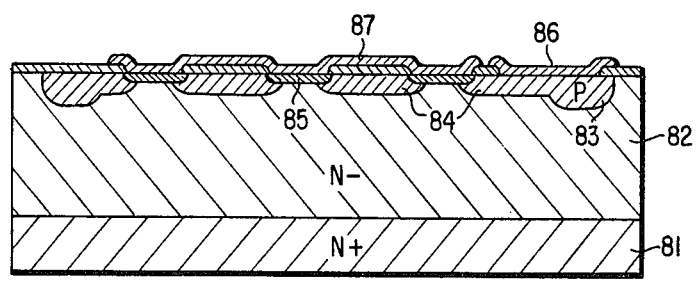

Referring now to FIG. 10, the body of the device having a layered structure consisting of an N+ type diffusion layer 71 and an N− type region 72 is prepared, a BSG layer 73 is established on the upper surface of the N− type layer 72, only the parts that will form the gate regions are left and the rest of the BSG layer is removed by a photoengraving treatment. Next, a mixed glass layer 74 including boron and arsenic is establised on a whole surface of the body and only the parts that will form the source regions are left. The rest of the mixed glass layer is removed by a photoengraving treatment. When the source and gate selective diffusion sources have thus been established, heat treatment for diffusion is carried out. Boron atoms are selectively diffused directly downwards from the BSG layers 73 on the gate regions with the glass layers 74 as a mask. On the other hand, boron and arsenic atoms are selectively diffused directly downwards from the mixed glass layers 74 on the source regions with the BSG layers 73 as a mask. The boron atoms of the gate regions are introduced for establishing the gate regions 75, the arsenic atoms of the source regions for establishing the source regions 76, and the boron atoms, diffused from the same glass layers 74 as the arsenic atoms, for changing the specific resistance value of the channel regions 77 in that part only. (See FIG. 9b).

The important factor is the relationship between the concentration of the boron aroms diffused simultaneously from the same glass layers 74 as the arsenic atoms for forming the source regions 76 and the concentration of donor atoms in the N− type layer 72 initially used. When the quantities are compared, if the former concentration is higher, extremely narrow P type layers are introduced into the channel regions 77 below the source regions 76. If the former concentration is lower, the specific resistance value of the channel regions becomes high. Also, if the former and the latter concentrations are equal (strictly speaking, the impurity atoms are uniformly distributed throughout the N− type layer and boron atoms are introduced into the body by a diffusion process so the concentration distribution is an error function and therefore an equal concentration in the whole region of the channel cannot occur), the parts below the source regions 76 become intrinsic layers.

An experimental example will now be described. As conditions for the establishment of the BSG layer 73, the body temperature is 450° C, the flow rate of diborane gas having a concentration of 50 ppm is 0.5 lit/min, the flow rate of silane having a concentration of 3% is 0.7 lit/min and the flow rate of oxygen gas is 0.3 lit/min. In this mixed gas atmosphere, the flow rate of nitrogen gas is 35 lit/min and the heat treatment is carried out for 5 minutes. By this means, the thickness of the BSG layer 73 becomes about 3000 A. As conditions for the establishment of the mixed glass layer 74, the body temperature is 450° C, the flow rate of diborane gas having a concentration of 10 ppm is 0.5 lit/min, the flow rate of arsine gas ($AsH_3$) having a concentration of 1000 ppm is 0.8 lit/min, the flow rate of oxygen gas is 2.5 lit/min and the flow rate of silane gas having a concentration of 50 ppm is 0.7 lit/min. In this mixed gas atmosphere, the flow rate of nitrogen gas is 35 lit/min and the heat treatment is carried out for 5 minutes. By this means, the thickness of the mixed glass layer 74 becomes about 3000 A. In order to effect diffusion from the glass diffusion sources established in this way, a heat treatment is carried out at a temperature of 1050° C for 80 hours in a weekly oxidizing atmosphere. If the donor concentration in the N− layer 72 used under these circumstances is $5 \times 10^{14}$ atoms/cm$^3$ (10Ω cm), the diffusion parameters of the respective impurity atoms are as follows: diffusion depth of boron atoms of the gate regions, 4$\mu$, surface concentration, $3 \times 10^{16}$ atoms/cm$^3$, depth of diffusion of the arsenic atoms of the source regions, 1.5$\mu$, surface concentration, $1 \times 10^{17}$ atoms/cm$^3$, depth of diffusion of boron atoms of the source regions, 1.5$\mu$, surface concentration, $6 \times 10^{15}$ atoms/cm$^3$. Approximately intrinsic layers are introduced at the ends of the source regions 76. In the channel regions 77, up to about 1$\mu$ from the ends of the source regions, the resistance value can be increased to about 20 Ω cm. Also, if the quantity of boron atoms contained in the diffusion sources for forming the source regions is made greater than the quantity stated above, the effect of increasing the resistance of the channel regions gradually becomes smaller.

When FETs in which the above mentioned boron atom content differs are made in this way and their triode characteristics are observed, it is found that if P− type reversing layers are introduced at the interfaces between the source regions and the channel regions, the current flow is initially small when gate voltage is not applied. The reason is that drain current cannot flow until that voltage is reached which is necessary for "punch-through", to a zero under approximation, of the interposed $\pi$ type reversing layer by the application of the drain voltage. Moreover, in the case in which a N$\nu$ type layer is interposed, a slight drop in voltage occurs there and therefore the starting of the current becomes rather poor. However, in the cases in which a $\pi$ type reversing layer or a $\nu$ type layer is interposed at the source and channel region interface, a depletion layer is easily interposed by the application of the gate voltage. Therefore, $\mu$ becomes extremely great. According to numerical values ascertained experimentally, when a $\pi$ type reversing layer was interposed, $\mu$ became several times greater than when the source diffusion was made with arsenic atoms only.

In the invention described above, arsenic and boron were adopted as the diffusion impurity atoms in the mixed glass layers on the source regions and therefore extremely precise control of the diffusion layer surface concentration of the respective impurity atoms was necessary. However, if acceptor atoms with greater diffusion coefficients are chosen, the required concentration distribution is obtained commmparatively easily. For example, if gallium is used instead of boron, the diffusion coefficient is about three times as great. Therefore it can be distributed more easily than in the case of the distribution of boron as an impurity. Therefore, the control of the concentration at the ends of the source regions is easier. Also, in order to change the specific resistance or the conductivity type of the channels, use may be made of a plurality of diffusion steps of which the times differ, without using two or more kinds of impurity atoms of which the diffusion coefficients differ.

Of course, when the source regions 76 are formed by diffusion, the exposed portions of the gate junctions at the surface of the body should be covered with a silicon dioxide layer 78. A source electrode 79, a gate electrode 80 and a drain electrode should be established in the same way as in the previously described embodiments. When the structure of the present invention is as described above, this sturcture is one in which the source regions are directly surrounded by the gate regions and therefore the high frequency characteristics are excellent and the $\mu$ of the FET can be controlled as required.

Also, in this embodiment the gate and source regions may alternatively be formed by any of the methods of the first and fourth embodiments described above and the resistance in the vicinity of the source regions may be changed.

A sixth embodiment will now be described with reference to FIG. 11. This embodiment is an example of a case in which the outer peripheral part of the gate region is purposely made deeper than the other portions so that the gate resistance to voltage is improved. In a diffused vertical type FET, the body of the device is, for instance, a layered structure consisting of an N+ diffusion layer 81 and an N− type region 82. When the gate and source regions are formed in this N− type layer 82, the voltage resistance between the gate and the drain is determined by the specific resistance of the N− type layer 82 and its thickness and the depth of diffusion of the gate region.

The above mentioned gate resistance to voltage depends on the depth of diffusion, more particularly, when the gate region is established by diffusion. Thus, if the specific resistance of the N− type layer is several $\Omega$ cm, then the curvature of the PN junction of the gate region made by selective diffusion is related to its junction voltage resistance. Since, because of the structure of the vertical type FET, the depth of diffusion of the gate is not large, it is usually not possible to improve the gate resistance to voltage without changing the characteristics of the FET.

Therefore, before the gate region is established, a deep P type diffusion region 83 is formed in the part which will become the outer peripheral part of the gate region by selective diffusion using a silicon dioxide layer and a photoengraving treatment. Afterwards, by the same methods as described in the preceding embodiments, gate regions 84 and source regions 85 are established, a gate electrode 86 and a source electrode 87 are established and a drain electrode is led out from the N+ type layer 81 and the vertical type FET is complete.

When this is done, the voltage resistance between gate and drain is determined by the design parameters and particularly by the junction curvature produced in the outer peripheral part 83 of the gate region. This is a very good way of improving the gate voltage resistance without changing the other apparatus parameters. Moreover, if the gate electrode 86 is led out from the surface of the peripheral part of the gate region, the direct current resistance in a perpendicular direction as regards the cross section of the peripheral part becomes small. Therefore, as regards the peripheral part of the gate region, the direct current resistance in a vertical direction is small and consequently the current capacity per unit area can be made greater.

Also, in this embodiment, the gate and source regions can be formed by any of the methods of the first to fourth embodiments described previously. By making the outer peripheral part of the gate region thick, devices having the same advantages can be provided.

Figure 12A:
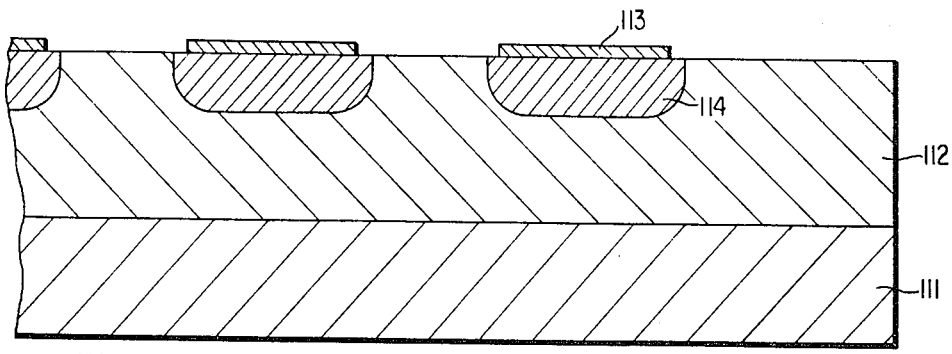
Figure 12B:
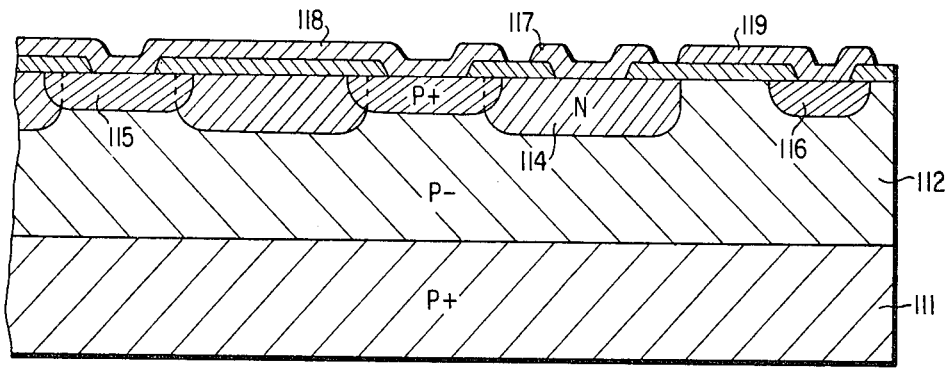

A seventh embodiment will not be described with reference to FIG. 12. This embodiment is one in which the gate reverse current of a vertical type FET is reduced and the voltage resistance between gate and drain is improved. The following description is directed to a P channel FET. First, the body of the device having a layered structure consisting of a P+ type diffused layer 111 and a P− type or $\pi$ type region 112 is prepared. In this specification, a semiconductor layer with a high specific resistance close to an intrinsic semiconductor is called a $\pi$ layer in the case of a P channel and a $\alpha$ layer in the case of an N channel. A layer of silicon dioxide to which phosphorus atoms have been added (PSG layer) is established on the upper surface of the region 112 and, by a photoengraving treatment, PSG layers 113 which constitute gate region diffusion sources remain from the dioxide layer and the rest of the PSG layer is removed. After this, a heat treatment is carried out so that selective diffusion of phosphorus atoms from the PSG layers is effected and gate regions 114 are established. Next, holes for forming the source regions 115 by diffusion are made. At the same time, part of the silicon dioxide layer on the outside is removed from the periphery of the gate regions 114 by a photoengraving treatment. These silicone dioxide layers are formed when the gate regions 114 are diffused. The above mentioned removed parts are formed on the outside from the periphery of the gate regions at necessary intervals for maintaining the gate voltage resistance. Boron is diffused through the holes formed by this means whereby P+ type source regions 115 and a P+ channel prevention region 116 are established. The gate electrode 117 and the source electrode 118 are established by the usual method. If, at the same time, part of the silicon dioxide layer on the P+ channel prevention region 116 is removed by photoengraving and a metal layer 119 having an ohmic contact extends over the edge of the peripheral part of the gate regions and is so established that the electric field leaking from the depletion layer (produced when a reverse voltage is applied to the gate electrode) becomes equipotential at the surface of the device, the channel formation prevention effect is assisted. Also, a drain electrode is led out from the P+ layer 111.

When a high voltage resistance FET is designed, the high specific resistance region 112 that is used is generally one having a specific resistance not less than 20Ω cm. Moreover, when the FET has a P channel, even if the specific resistance of the high specific resistance region 112 is not very high, at the interface of the region 112 at the outer periphery of the gate region, the silicon dioxide layer N type reversing layer is readily produced. The layer is produced by the effect of the redistribution of the impurity atoms when the silicon dioxide layer is being formed and by the effect of the alkali ions in the silicon dioxide, by the effect of the ions in the external atmosphere due to the outside leakage field of the field of the depletion layer when a reverse voltage is applied between the gate and the drain, by the effect of the redistribution of the polarized molecules, and the like. Also, when the FET has a P channel, if the N− type layer has a relatively high resistance, there are cases in which the ions in an external atmosphere due to the outside leakage field of the field produced in the depletion layer, the redistribution of the polarized molecules, the polarization of foreign bodies at the surfaces of the silicon dioxide layer and the like cause a $\nu$ type or $\pi$ type reversing layer to be produced at the interface of the N− type layer and the silicon dioxide. When this kind of reversing layer is produced, the gate reverse current increases. Moreover, the resistance to voltage between gate and drain deteriorates and the reliability is reduced. Therefore, in order to prevent a reversing layer of this kind from spreading, the metal layer 119 is provided to surround the periphery of the gate region with a highly doped layer and also to make the top of the silicon dioxide layer up to the gate region equipotential to solve the abovementioned problem.

Also, in this embodiment the gate and source regions can be formed by any of the methods of the previously described first to fourth embodiments, and the same effect can be achieved by providing a channel prevention region for preventing reversal.

Figure 13A:
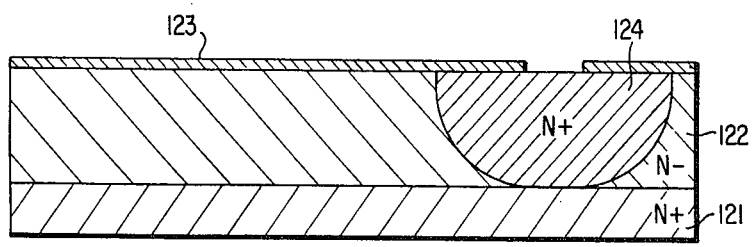
Figure 13B:
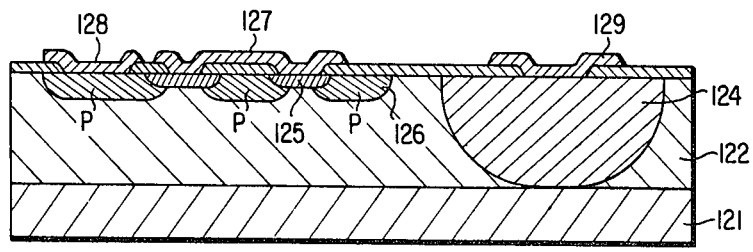

An eighth embodiment will now be described with reference to FIG. 13. This embodiment is an example of a case in which the drain electrode is taken out from the same main surface of the body of the device as the source and gate electrodes. The description concerns the case of an N channel FET. First, the body of the device having a layered structure of an N+ type diffused layer 121 and an N− type region 122 is prepared, the upper surface of the N− type layer 122 is oxidized so that a silicon dioxide layer 123 is formed, after which a part of this dioxide layer is chemically removed by photoengraving, and diffusion of phosphorus atoms is effected through the opening of the layer. The N+ type diffusion layer 124 formed by this means extends through the N− type layer 122 and reaches the N+ type diffusion layer 121. In this case, since it is necessary to make the position of the N+ type layer 124 clear in the subsequent steps, heat treatment is carried out in an oxidizing atmosphere. The hole in the silicon dioxide which was used for selective diffusion is covered by a comparatively thick oxide film. Next, the silicon dioxide formed on the N− type layer 122 and the N+ type diffused layer 124 is etched and removed over the whole surface. At the location of the hole for the above mentioned selective diffusion, an extremely shallow depression is produced because of the formation of the new silicon dioxide. Therefore, this depression is used as a reference in establishing source regions 125, gate regions 126, source electrode 127 and gate electrode 128 by the same method as was used in the embodiment of FIG. 4. Simultaneously, with the establishment of these electrodes, a hole is made by a photoengraving treatment in part of the silicon dioxide layer above the N+ type diffused layer 124 and the drain electrode 129 is taken out.

The above mentioned N+ type diffused layer may be so established as to surround the peripheral part of the gate region and the drain electrode may be taken out in one or several places at convenient locations around the gate region. The object of this N+ type diffused layer 124 is so that the drain electrode 129 is led out equipotentially with the N+ type layer 121. Instead of a diffusion process, it is possible to provide a hole extending to the N+ type layer 121 by chemically etching the silicon from the main surface and to take out a metal electrode from the bottom of this hole. This object may also be achieved by a combination of chemical etching and diffusion. If, in this way, the drain electrode is taken out on the same side as the gate and source electrodes, this provides a convenient structure in cases where it is desirable to establish a metal plate solely for heat discharge on the opposite surface of the body and thus take out the drain electrode from the upper surface of the base plate.

Also, in this embodiment, the source and gate regions may be formed by any of the methods of the previously described first to fourth embodiments. In this case also, the construction may be one in which the drain electrode is taken out from the same side as the gate and source electrodes. Moreover, the previously described fifth to eights embodiments may of course be combined with one another in carrying the invention into effect.

As described above, when the present invention is used, the gate region is in direct contact with the source region and surrounds that region in the form of a ring and this gate region and source region have an exposed part in common so that the gate series resistance $r_G$ becomes small, the pinch-off action is reliable and the PN junction capacity $C_{GS}$ between the gate and source regions becomes small. Therefore, the time constant $C_{GS} \cdot r_G$ becomes small so that a semiconductor apparatus with outstanding high frequency characteristics can be provided.

Each of the embodiments described previously was described as a vertical type FET of the multi-channel type in which a plurality of gate regions are formed in the base plate. However, the invention may be directed to a vertical type FET in which there is a semiconductive region of the N conductive type (or of the P conductive type) forming a drain region in the body of the device and only one channel is formed in the body. Thus, incorporation of a vertical type FET of this kind in an integrated circuit using a P or N body can easily be carried out and its construction as a P channel FET is also clear from the preceding descriptions of an N channel FET. Also, although in the first to seventh embodiments the body of the device comprised a multilayer semiconductive region with concentrations differing from one another, it may comprise a single semiconductive region.

Obviously, numerous modifications and variations of the present invention are possible in light of the above teachings. It is therefore to be understood that within the scope of the appended claims the invention may be practiced otherwise than as specifically described herein.

What is claimed as new and desired to be secured by Letters Patent of the United States is:

1. A vertical type junction field effect transistor comprising:
    a body of semiconductor material having first and second main faces,
    the body including:
    a source region of a first conductivity type and having a high concentration of conductivity type determining impurities, the source region extending into the body from the first main face of the body;
    a drain region of the first conductivity type and having a high concentration of conductivity type determining impurities, the drain region extending into the body from the second main face of the body and disposed opposite the source region;
    a gate region of a second conductivity type opposite to the first conductivity type, the gate region extending into the body from the first main face of the body and directly contacting and surrounding the source region in the form of a closed loop to form a PN junction between the source region and the gate region at only an outer edge of the source region to maintain the gate to source capacity small and to maintain the time constant on the gate input side small; and
    a channel region of the first conductivity type and having a low concentration of conductivity type determining impurities, the channel region extending from the source region towards the drain region and having a channel of varying width in the vicinity of the source region according to the change of a depletion layer arising in the channel region upon voltage application to the gate region.

2. A vertical type junction field effect transistor according to claim 1 wherein the gate region is disposed deeper than the source region.

3. A vertical type junction field effect transistor according to claim 1 wherein the gate region comprises a closed loop mesh with the mesh extending along the length of each loop to the first main face of the body and the source region extends from the first main face of the body in each of the loops.

4. A vertical type junction field effect transistor according to claim 1 wherein the resistance of the channel region varies in the direction from the source region to the drain region.

5. A vertical type junction field effect transistor according to claim 1 wherein the depth of the source region from the first main face is substantially the same as the depth of the gate region from the first main face.

6. A field effect transistor according to claim 3 wherein the gate region around the periphery of the closed loop mesh is of greater depth then the remaining part of the gate region.

7. A vertical type junction field effect transistor according to claim 1 wherein the body includes a further region of the first conductivity type and having a high concentration of conductivity type determining impurities provided laterally of the gate region, the further region extending into the body from the first main face and into contact with the drain region, thereby connecting the drain region to the first main face of the body.

8. A vertical type junction field effect transistor according to claim 7 including a first electrode contacting the drain region, a second electrode contacting the gate region, and a third electrode contacting the source region, the first, second, and third electrodes disposed on the first main face of the body.

* * * * *